United States Patent
Kwon et al.

(10) Patent No.: US 7,445,724 B2
(45) Date of Patent: *Nov. 4, 2008

(54) METHOD FOR MANUFACTURING PRINTING PLATE

(75) Inventors: Oh Nam Kwon, Yongin-si (KR); Heung Lyul Cho, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/416,016

(22) Filed: May 2, 2006

(65) Prior Publication Data

US 2007/0048676 A1   Mar. 1, 2007

(30) Foreign Application Priority Data

Aug. 29, 2005   (KR) .................. 10-2005-0079594

(51) Int. Cl.
*B44C 1/22* (2006.01)
(52) U.S. Cl. ................... 216/41; 216/51; 216/83; 438/745; 430/300; 430/302
(58) Field of Classification Search ............... 216/41, 216/51, 83; 438/745; 430/300, 302
See application file for complete search history.

(56) References Cited

U.S. PATENT DOCUMENTS

| 6,190,988 B1 * | 2/2001 | Furukawa et al. ........... 438/386 |
| 2003/0060037 A1 * | 3/2003 | Wu ........................... 438/637 |
| 2004/0178170 A1 | 9/2004 | Morimoto |
| 2005/0158987 A1 | 7/2005 | Choi |
| 2007/0015093 A1 * | 1/2007 | Yoo et al. .................... 430/346 |

OTHER PUBLICATIONS

Office Action issued in corresponding Chinese Patent Application No. 200610090312.1; issued May 9, 2008.

* cited by examiner

*Primary Examiner*—Shamim Ahmed
(74) *Attorney, Agent, or Firm*—Brinks Hofer Gilson & Lione

(57) ABSTRACT

A method for manufacturing a printing plate to acheive a precise and fine pattern by minimizing a variation of etching critical dimension is disclosed. The method uses a hard mask having an opening on an insulating substrate to form a first trench having a first depth in the insulating substrate. A first etching stopper and a first photoresist may be applied on a surface of the insulating substrate including the first trench for patterning the first photoresist by exposing the first photoresist. Likewise, a second and third trench may be formed.

19 Claims, 5 Drawing Sheets

METHOD FOR MANUFACTURING PRINTING PLATE

This application claims the benefit of the Korean Patent Application No. P2005-79594, filed on Aug. 29, 2005, which is hereby incorporated by reference as if fully set forth herein.

BACKGROUND

Discussion of the Related Art

Various displays that can substitute for a cathode ray tube ("CRT") have been developed that have various advantages of portability, light weight, a thin profile, small size, good picture quality, etc. One example of the substitute displays is a liquid crystal display ("LCD") device.

In general, a LCD device is comprised of a thin film transistor ("TFT") array substrate, a color filter ("CF") substrate, and a liquid crystal layer formed between the TFT array substrate and the CF substrate. On the TFT array substrate, a plurality of gate lines are formed in perpendicular to a plurality of data lines, so as to define a plurality of pixel regions arranged in the form of a matrix. Also, a plurality of thin film transistors TFTs are formed adjacent to crossings of the gate and data lines, wherein the plurality of thin film transistors serve as switching devices. In addition, a pixel electrode of a transparent metal material is formed in the unit pixel region of the TFT array substrate. Then, a RGB color filter layer and a black matrix layer are formed on the CF substrate corresponding to the pixel electrode.

The TFT array substrate and the CF substrate are separately manufactured, that is, they are formed on separate substrates. Before bonding the TFT array substrate and the CF substrate together, steps of alignment coating, rubbing, spacer dispensing, and seal printing are performed in sequence.

After completing the above steps, the TFT array substrate and the CF substrate are positioned opposite one another. The TFT array substrate and the CF substrate are then bonded to each other by heat and ultra-violet ("UV") irradiation. The seal printing step is performed next to bond the two substrates to each other and to prevent the outflow of liquid crystal molecules by sealing.

A seal formation method may be considered to include three categories, such as a printing method, a sandblast method and a dispensing method.

The printing method is generally used for a method of manufacturing an LCD or a plasma display panel ("PDP") in that the printing method requires a simple apparatus and has a good material result. After positioning a patterned screen above a substrate, a paste for formation of a wall is printed on the substrate through compression of the screen. Through one printing process, it is possible to obtain a height of about 20 µm. To form a wall having a height of 50 µm to 100 µm, it is necessary to perform the printing process 5 to 10 times, which in turn require several drying steps. Accordingly, the printing method has low yield. In addition, since a glass substrate is deformed, it may be difficult to achieve high resolution.

The sandblast method is used for a fine wall of a large-sized panel. In the sandblast method, a wall material is coated on a substrate, and is selectively removed, to thereby form a wall. For example, a wall material is printed on an entire surface of a substrate using a screen printing method. Then, a photoresist film is formed on the wall material, and is selectively patterned by exposure and development. Then an abrasive material is sprayed onto the substrate, so as to partially remove the substrate having no photoresist film, thereby forming the wall. The abrasive material may include $Al_2O_3$, SiC or glass particles, which is sprayed using compressed air or nitrogen gas. By the sandblast method, it is possible to form the wall of 70 µm or less on the large-sized substrate. However, the glass substrate may be broken from a physical impact. Also, the process of sandblast may be complicated, whereby the manufacturing cost may increase. Further, an environmental pollution is generated due to dust.

The dispensing method may be used for a sealant of a large-sized LCD or PDP. In the dispensing method, a paste is directly dispensed on a substrate using a line data of CAD used for manufacturing a mask by air pressure. In the case of the dispensing method, it is possible to utilize the simplified process for various applications.

FIGS. 1A to 1C are cross sectional views of illustrating a process for forming a pattern material layer on a substrate with a printing roller according to the related art.

As shown in FIG. 1A, first, a pattern material 30 is provided through a printing nozzle 10, and is coated on a printing roller 20.

Then, as shown in FIG. 1B, the printing roller 20 having the pattern material 30 coated thereon rolls on a printing plate 40 having a plurality of concave patterns. Accordingly, some pattern material 30b is printed on the printing plate 40, and the other pattern material 30a is left on the printing roller 20. That is, a predetermined pattern of the pattern material is formed on the printing roller 20.

Referring to FIG. 1C, as the printing roller 20 having the pattern material of the predetermined pattern rolls on a substrate 50, the pattern material 30a is printed on the substrate 50. The patterning method using the printing roller requires the printing plate. A method for manufacturing a printing plate will be described as follows.

A method for manufacturing a printing plate according to the related art will be described with reference to the accompanying drawings. FIGS. 2A to 2E are cross sectional views illustrating a method for manufacturing a printing plate according to the related art. As shown in FIG. 2A, a metal layer 52 for a hard mask is deposited on an insulating substrate 51, and a photoresist 53 is coated on the metal layer 52. The metal layer 52 may be formed of Cr or Mo. Then, the photoresist 53 is selectively patterned by exposure and development, to thereby define a pattern area.

Referring to FIG. 2B, the metal layer 52 is selectively removed using the patterned photoresist 53 as a mask, to thereby form a metal layer pattern 52a. Compared with FIG. 2A, the metal layer 52 is removed where it is not found under the photoresist 53.

As shown in FIG. 2C, the photoresist 53 is removed from FIG. 2B. To form the metal layer pattern 52a, the photoresist 53a is removed using oxygen gas plasma or various oxidizers. In one example, oxygen gas plasma is generated by proving oxygen gas, and the oxygen gas plasma reacts with the photoresist, resulting in the removal of the photoresist.

As shown in FIG. 2D, the exposed insulating substrate 51 is selectively etched using the metal layer pattern 52a as a mask, to thereby form a trench 54 having a depth of about 20 µm. When etching the insulating substrate 51, an isotropic etching method using a hydrofluoric ("HF") based etchant.

As shown in FIG. 2E, the metal layer pattern 52a is removed, thereby completing the printing plate and leaving only the insulating substrate with the trenches 54.

The complete printing plate is provided to the printing apparatus shown in FIGS. 1A-1C. After the printing material is coated on the printing roller, the printing roller rolls on the printing plate. Thus, some of the printing material is printed on the predetermined pattern of the printing plate, and the other printing material is left on the printing roller. That is, a predetermined pattern of the printing material is formed on the printing roller. As the printing roller having the printing material of the predetermined pattern rolls on a substrate, the printing material of the predetermined pattern is printed on the substrate.

However, the method for manufacturing the printing plate according to the related art has the following disadvantages. In the method for manufacturing the printing plate according to the related art, the trench having the predetermined depth is formed by the isotropic etching method of etching the insulating substrate using the metal layer pattern as the mask, whereby an etching critical dimension ("CD") is large. As a result, it is difficult to manufacture the precise printing plate. That is, if the etching thickness of the insulating substrate is about 5 µm, it is impossible to obtain a line width A (from FIG. 2D) of 10 µm or less.

SUMMARY OF THE INVENTION

Accordingly, the present embodiments are directed to a method for manufacturing a printing plate, which substantially obviates one or more problems due to limitations and disadvantages of the related art.

In a first aspect, a method for manufacturing a printing plate includes the formation of a hard mask layer having at least one opening on an insulating substrate. The formation of at least one first trench occurs in the insulating substrate corresponding to the at least one opening of the hard mask layer. The at least one first trench has a first depth. The formation of a first etching stopper and a first photoresist sequentially occurs on a surface of the insulating substrate including the at least one first trench. The first etching stopper and the first photoresist are patterned such that a portion of the first etching stopper and a portion of the first photoresist remain at sidewalls of the at least one first trench. The formation of at least one second trench occurs in the insulating substrate. Each of the at least one second trench corresponds to each at least one first trench respectively. The at least one second trench has a second depth greater than the first depth.

In a second aspect, a printing plate with at least one trench includes an insulating substrate including the at least one trench. A metal layer pattern is coupled with the insulating substrate and at least partially does not cover the at least one trench. A first photoresist portion is located in the at least one trench and is coupled with the metal layer pattern. The first photoresist portion is located at a sidewall of the at least one trench. A first etching stopper portion is coupled with the first photoresist portion.

In a third aspect, a method for developing a printing plate includes providing a hard mask layer with a gap on an insulating substrate. A first trench is located in the insulating substrate corresponding to the gap of the hard mask layer. A first etching stopper and a first photoresist are located on the insulating substrate including the first trench. The first etching stopper and the first photoresist are patterned such that a portion of the first etching stopper and a portion of the first photoresist are located at sidewalls of the first trench. A second trench is provided in the insulating substrate corresponding to the first trench.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings are included to provide a further understanding of the embodiments. The drawings are incorporated in and constitute a part of this application, and illustrate embodiment(s) of the disclosure and together with the description serve to explain the principle of the embodiments. In the drawings.

DETAILED DESCRIPTION

Reference will now be made in detail to the embodiments of the present disclosure, examples of which are illustrated in the accompanying drawings. Wherever possible, the same reference numbers will be used throughout the drawings to refer to the same or like parts. Hereinafter, a method for manufacturing a printing plate according to the present invention will be described with reference to the accompanying drawings.

FIGS. 3A to 3G are cross sectional views illustrating a method for manufacturing a printing plate according to one embodiment.

Figure 3A:
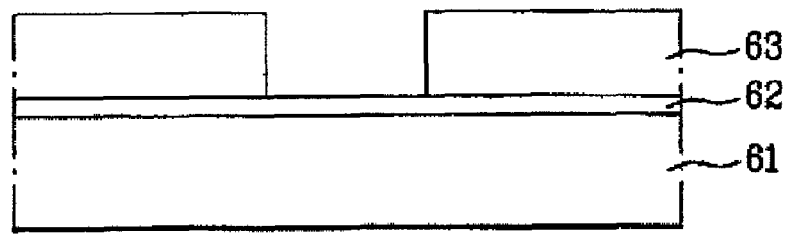
FIGS. 3A to 3G are cross sectional views illustrating a method for manufacturing a printing plate according to an embodiment.

As shown in FIG. 3A, a metal layer 62 for a hard mask is deposited on an insulating substrate 61 of glass, and a first photoresist 63 is coated on the metal layer 62. The metal layer 62 is formed of chromium ("Cr") or molybdenum ("Mo"). The first photoresist 63 is selectively patterned by exposure and development, to thereby define at least one pattern area.

Figure 3B:
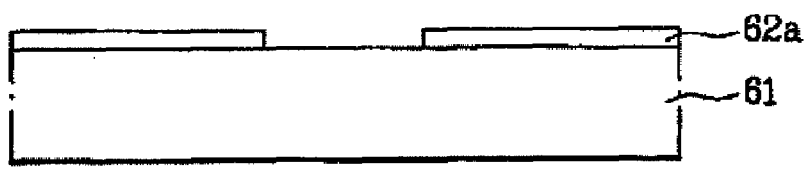

As shown in FIG. 3B, the metal layer 62 is selectively removed using the patterned first photoresist 63 as a mask, thereby forming a metal layer pattern 62a. The metal layer pattern 62a includes at least one area in which the metal layer 62 has been removed. The at least one area in which the metal layer 62 has been removed may also be referred to as at least one hole, opening, or gap in which a trench may be created. In various embodiments, there may be one or more openings on the surface of the substrate in which a trench is created. Then, the first photoresist 63 is removed. To form the metal layer pattern 62a, the first photoresist 63 used as the mask is removed using oxygen gas plasma or various oxidizers. For example, in the case of oxygen gas plasma, which is generated by providing oxygen gas under the vacuum and high voltage states, the oxygen gas plasma reacts on the photoresist, resulting in the removal of the photoresist.

In an alternate embodiment, the first photoresist 63 may not be removed. As shown in FIG. 3B, the first photoresist 63 is removed, however, the first photoresist 63 may remain even as the metal layer 62 is selectively removed forming metal layer pattern 62a. According to this embodiment, the first photoresist 63 remains throughout the process and is located on the metal layer pattern 62a. The following description describes an embodiment in which the first photoresist 63 is removed, however, it should be understood that the first photoresist 63 may remain.

Figure 3C:
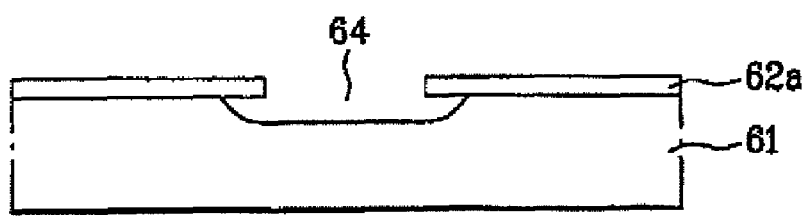

As shown in FIG. 3C, the exposed insulating substrate 61 is selectively etched using the metal layer pattern 62a as a mask, to thereby form at least one trench, such as a first trench 64 having a first depth that may vary from 2 µm to 6 µm. In an alternate embodiment, the depth may vary beyond 2 µm to 6 µm. When etching the insulating substrate 61, an isotropic etching method using HF-based etchant is used. Upon forming the first trench by the isotropic etching method, etched portions are extended to lateral sides. As the depth of the first trench 64 is decreased, it is possible to decrease the etched portions at the lateral sides of the trench.

Figure 3D:
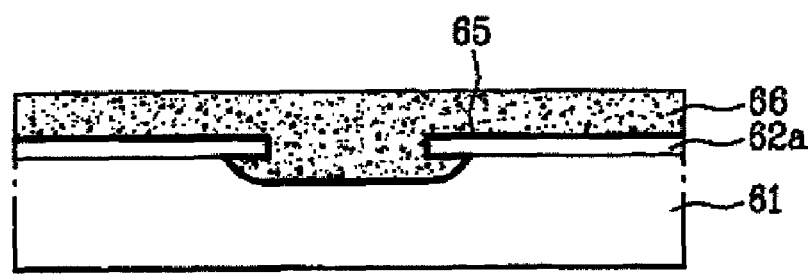

As shown in FIG. 3D, a first etching stopper 65 is formed on the insulating substrate 61 including the metal layer pattern 62a and the first trench 64, and a second photoresist 66 is coated on an entire surface of the insulating substrate 61 including the first etching stopper 65. The first etching stopper 65 may be formed from a transparent or opaque metal material, such as indium-tin-oxide ("ITO"), molybdenum ("Mo") or copper ("Cu"), at an approximate thickness of 0.01 µm to 0.3 µm. In an alternate embodiment, the first etching stopper 65 may be formed from a different material at a variable thickness.

The second photoresist 66 may be formed using a spin coating method, a spray coating method, a dip coating method, or other methods now known or later developed. The spin coating method is common based on its advantageous characteristics of stability and uniformity.

The photoresist 66 may be categorized into a positive type or a negative type. The negative type photoresist is formed by adding a mixture of hard rubber resin and a bis-diazide based compound to a photosensitive organic solvent of a bridging material. In the case of the negative photoresist, the portion irradiated with light is hardened, and a difference in solubility is generated between the portions irradiated and unirradiated with light, to thereby form the pattern.

In the case of the positive type photoresist, the portion irradiated with light is removed by developer (such as an alkali-based material), and the portion unirradiated with light is not removed, to thereby form the pattern. Generally, the positive type photoresist is formed of a mixture of quinondiazide based photoresist, alkali-soluble phenol-based resin and organic solvent, wherein the mixture is insoluble, however, the mixture becomes soluble in the alkali etchant by light irradiation.

Figure 3E:
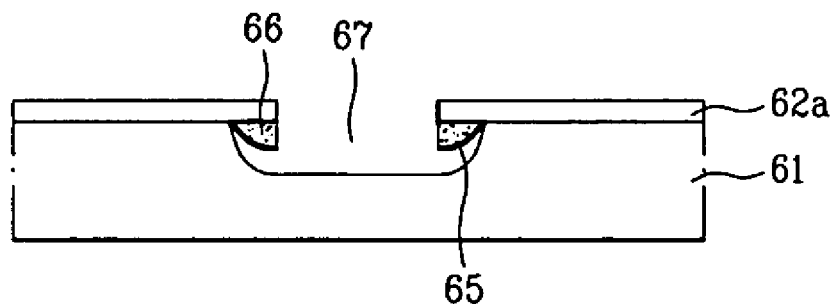

In the method for manufacturing the printing plate according to one embodiment, the positive type photoresist is used. As shown in FIG. 3E, exposure and development are performed to the second photoresist 66 using the metal layer pattern 62a as a mask. If the second photoresist 66 is coated on the entire surface of the insulating substrate 61, the second photoresist 66 is filled at lateral sides of the first trench 64 corresponding to the lower portions of the metal layer pattern 62a.

At this time, the development for the second photoresist 66 may be performed by deposition or spraying. If the second photoresist 66 is formed by deposition, it may be difficult to control the conditions of temperature, density and variations cause by time passage. However, in the case of spraying, it may become easier to control the above-conditions. If the exposure is applied to the entire surface of the second photoresist 66, the portion of the second photoresist 66 positioned under the metal layer pattern 62a is left inside the first trench 64, and the remainder of the second photoresist 66 is removed. The first etching stopper 65 is selectively removed using the patterned second photoresist 66 as a mask.

The insulating substrate 61 is then selectively removed using the metal layer pattern 62a and the patterned second photoresist 66 and first etching stopper 65 as a mask, whereby a second trench 67 is formed in the first trench 64. The second trench 67 has a second depth which is deeper than the first depth of the original trench 64. As explained above, when forming the second trench 67 by the isotropic etching, etched portions are extended to lateral sides. However, the first etching stopper 65 and the second photoresist 66 are left in the sides of the first trench 64, under the metal layer pattern 62a. Thus, it is possible to decrease the etched portions in the lateral sides of the second trench 67. Also, in one embodiment the second trench is 2 µm to 6 µm deeper than the first trench 64.

Figure 3F:
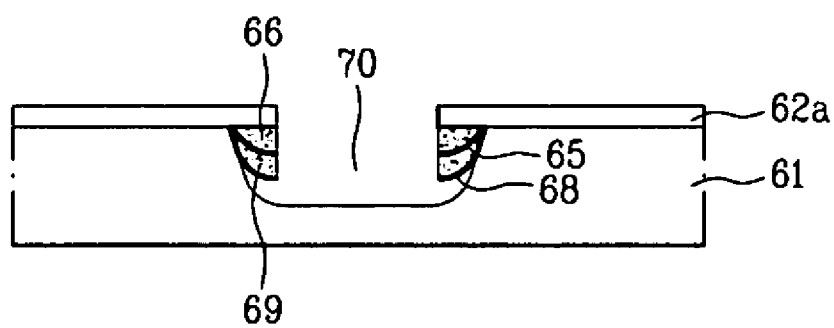

As shown in FIG. 3F, a second etching stopper 68 is formed on the entire surface of the insulating substrate 61 including the second trench 67. Then, a third photoresist 69 is coated on the entire surface of the insulating substrate 61 including the second etching stopper 68. The second etching stopper 68 may be formed of a transparent or opaque metal material such as ITO, Mo or Cu at a thickness of 0.01 µm to 0.3 µm. In an alternate embodiment, the second etching stopper 68 may be formed from other materials with a variable thickness. Then, exposure and development are performed using the metal layer pattern 62a as a mask, whereby the third photoresist 69 is left under the metal layer pattern 62a. The second etching stopper 68 is selectively removed using the patterned second photoresist 66 as a mask. The insulating substrate 61 is selectively etched using the metal layer pattern 62a and the patterned third photoresist 69 and second etching stopper 68 as a mask, to thereby form a third trench 70 in the second trench 67. The third trench 70 has a third depth which may be deeper than the second height or second depth from the second trench 67.

As explained above, when forming the third trench 70 by the isotropic etching, etched portions are extended to lateral sides. However, the second etching stopper 68 and the third photoresist 69 are left in the later sides of the second trench 67. In other words, the second etching stopper 68 and the third photoresist 69 are left under the metal layer pattern 62a, so that it is possible to decrease the etched portions in the lateral sides of the third trench 70. The third trench 70 may be 2 µm to 6 µm deeper than the second trench 67. As discussed above, the second and third photoresists 66 and 69 are formed according to the positive type. After the formation of the first trench 64, the formation of the first and second etching stoppers 65 and 68, the coating of the photoresist, the exposure and development are repetitively performed using the metal layer pattern 62a and the left photoresist as a mask, to thereby form a complete trench having a desired depth.

Figure 3G:
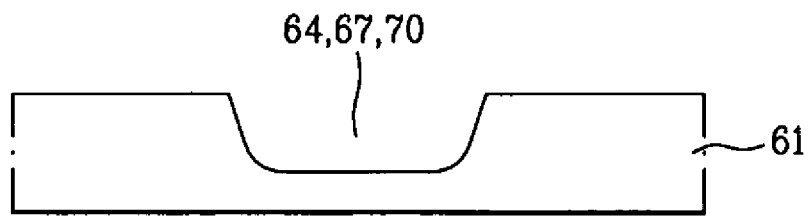

As shown in FIG. 3G, after removing the metal layer pattern 62a, the second and third photoresists 66 and 69 and the first and second etching stoppers 65 and 68 are removed. Then, a cleaning process is performed to the entire surface of the insulating substrate 61, so as to remove foreign particles generated by the etching, thereby completing the printing plate according to one embodiment.

In the method for manufacturing the printing plate according to one embodiment, the positive photoresist is repetitively coated, and then patterned by the self-alignment exposure and development. Also, the etched depth of the insulating substrate using the metal layer pattern 62a and the left photoresist as a mask is controlled so as to form a trench of the desired depth in the insulating of substrate 61.

When forming the first, second and third trenches 64, 67 and 70, the first and second etching stoppers 65 and 68 and the second and third photoresists 66 and 69 may be removed together by the final cleaning process, or may be respectively removed after the formation of each of the trenches.

Figure 1A:
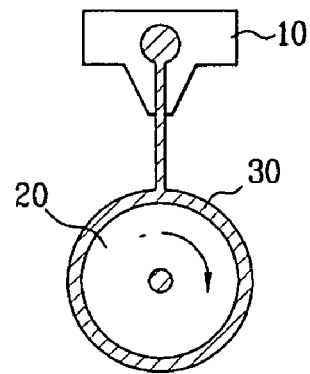
FIG. 1 is a schematic view illustrating a printing apparatus according to the related art.
Figure 1B:
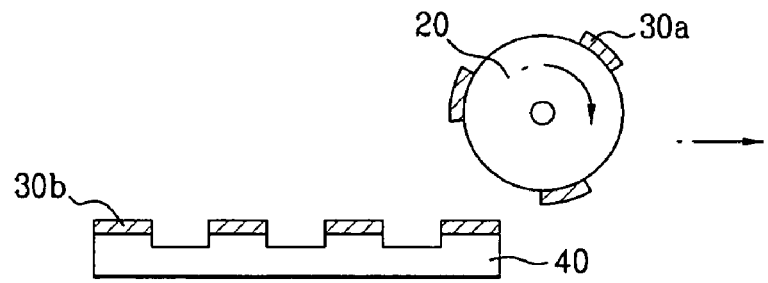
Figure 1C:
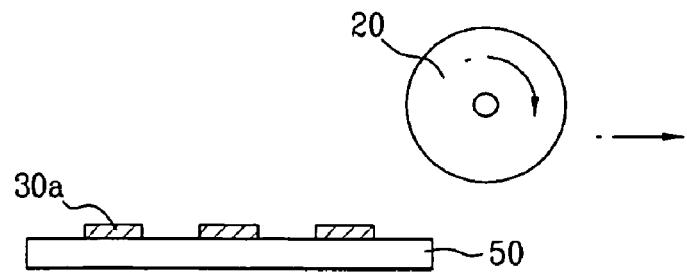
Figure 2A:
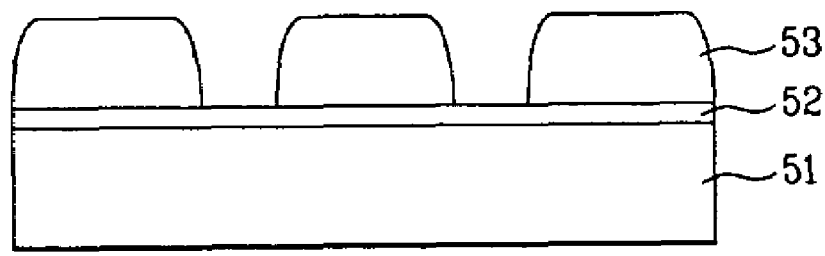
FIGS. 2A to 2E are cross sectional views illustrating a method for manufacturing a printing plate according to the related art.
Figure 2B:
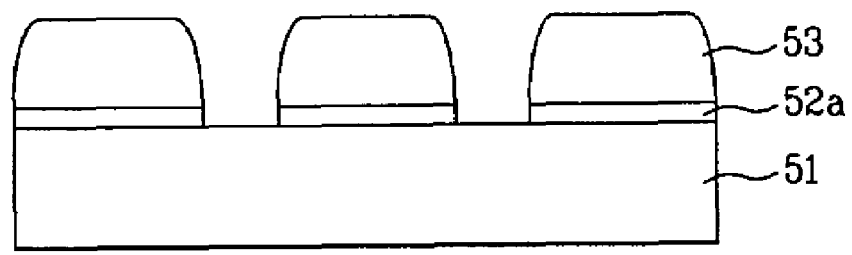
Figure 2C:
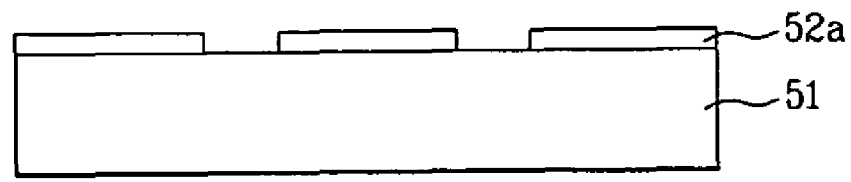
Figure 2D:
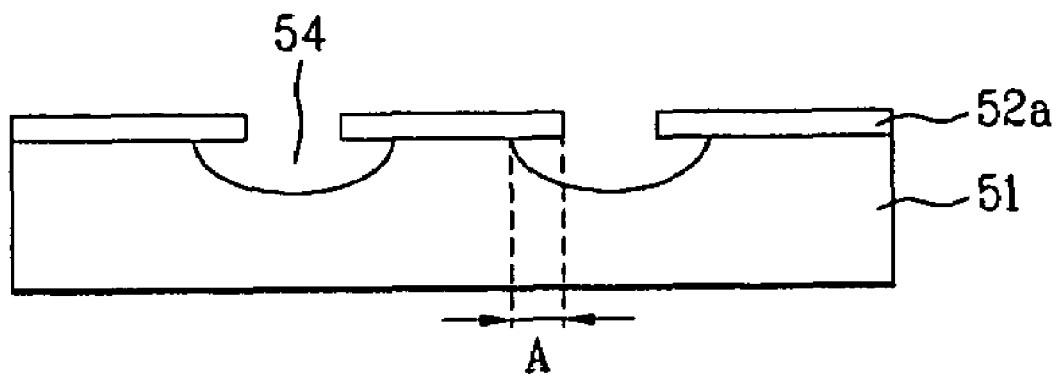
Figure 2E:
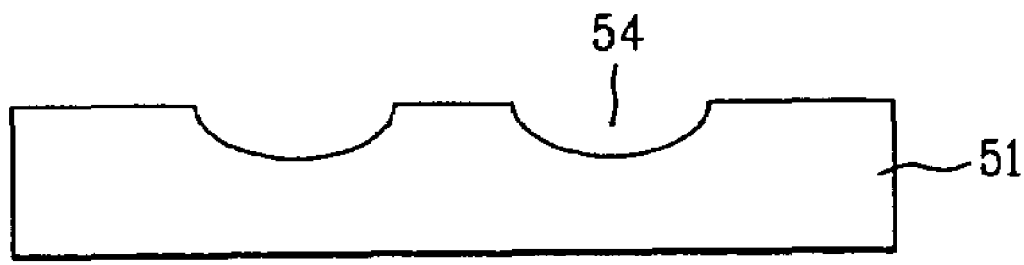

The complete printing plate is provided for a printing apparatus as shown in FIGS. 1A-1C. Then, after a desired pigment material is coated on the printing roller, the printing roller rolls on the printing plate. Thus, some of the desired pigment material is printed on the predetermined pattern of the printing plate, and the other desired pigment material is left on the printing roller. That is, a predetermined pattern of the desired pigment material is formed on the printing roller. As the printing roller having the desired pigment material of the predetermined pattern rolls on a substrate, the desired pigment material of the predetermined pattern is printed on the substrate.

In the related art method for manufacturing the printing plate, the trench of the desired depth is formed in the insulating substrate with one etching process using the photoresist or hard mask. However, in a method for manufacturing the printing plate according to one embodiment, the trench of the desired depth is formed in the insulating substrate from etching processes using the repetitive formation of the hard mask and etching stopper, the deposition of photoresist, and the entire exposure and development. In the case of the above embodiment, the three steps are performed so as to form a trench of the desired depth. Alternatively, it is not limited to the three steps. Also, as shown in FIGS. 3A-3G there is one hole or area in which the trenches are formed, however, it should be understood there may be at least one hole in which the process may be performed resulting in at least one first, second, and third trench located at different locations. In the method for manufacturing the printing plate according to one embodiment, the trench of the desired depth is formed in the insulating substrate with the several etching processes using the repetitive formation of the hard mask and etching stopper, the deposition of photoresist, and the entire exposure and development. In other words, the etched depth of the trench for each etching process is controlled so as to minimize the variation of the etching critical dimension, to thereby form the fine and precise pattern of the printing plate.

It will be apparent to those skilled in the art that various modifications and variations can be made in the present embodiments without departing from the spirit or scope of the embodiments. Thus, it is intended that the present embodiments cover modifications and variations provided they come within the scope of the appended claims and their equivalents.

What is claimed is:

1. A method for manufacturing a printing plate comprising:
    forming a hard mask layer having at least one opening on an insulating substrate;
    forming at least one first trench in the insulating substrate corresponding to the at least one opening of the hard mask layer, the at least one first trench having a first depth;
    forming a first etching stopper and a first photoresist sequentially on a surface of the insulating substrate including the at least one first trench;
    patterning the first etching stopper and the first photoresist such that a portion of the first etching stopper and a portion of the first photoresist remain at sidewalls of the at least one first trench, wherein the step of patterning the first etching stopper and the first photoresist comprises exposing the first photoresist using the hard mask layer as a mask, developing the exposed first photoresist and etching the first etching stopper using the developed first photoresist as a mask;
    forming at least one second trench in the insulating substrate, each of the at least one second trench corresponding to each at least one first trench respectively, wherein the at least one second trench has a second depth greater than the first depth.

2. The method of claim 1 further comprising:
    removing the hard mask layer, the first etching stopper and the first photoresist.

3. The method of claim 1, further comprising:
    forming a second etching stopper and a second photoresist sequentially on the surface of the insulating substrate including the at least one second trench;
    patterning the second etching stopper and the second photoresist such that a portion of the second etching stopper and a portion of the second photoresist remain at sidewalls of the at least one second trench;
    forming at least one third trench in the insulating substrate, each of the at least one third trench corresponding to each at least one first trench respectively, wherein the at least one third trench has a third depth greater than the second depth; and
    removing the hard mask layer, the first and second etching stoppers, and the first and second photoresists.

4. The method of claim 1, wherein the step of patterning the second etching stopper and the second photoresist comprises:
    exposing the second photoresist with the hard mask layer;
    developing the exposed second photoresist; and
    etching the second etching stopper.

5. The method of claim 1, wherein the first and second photoresists are formed of a positive photoresist type.

6. The method of claim 3, wherein the at least one first trench to the at least one third trench is formed by selectively etching the insulating substrate with a hydrofluoric ("HF")-based etchant.

7. The method of claim 1, wherein the hard mask comprises a metal layer.

8. The method of claim 7, wherein the metal layer comprises chromium ("Cr") or molybdenum ("Mo").

9. The method of claim 1, further comprising removing the first photoresist after forming the at least one second trench.

10. The method of claim 3, further comprising removing the second photoresist after forming the at least one third trench.

11. The method of claim 1, further comprising removing the first photoresist and the second photoresist after removing the hard mask.

12. The method of claim 3, wherein the first and second etching stoppers comprise a transparent or opaque metal material.

13. The method of claim 3, wherein each of the first and second etching stoppers are formed at a thickness of about 0.01 to 0.3☐.

14. The method of claim 3, wherein the first and second etching stoppers comprise at least one of indium-tin-oxide ("ITO"), molybdenum ("Mo") or copper ("Cu").

15. The method of claim 3, wherein each of the at least one first trench to the at least one third trench is formed with a depth of about 2 to 6☐.

16. A method for developing a printing plate comprising:
    providing a hard mask layer with a gap on an insulating substrate;
    providing a first trench in the insulating substrate corresponding to the gap of the hard mask layer;
    providing a first etching stopper and a first photoresist on the insulating substrate including the first trench;
    patterning the first etching stopper and the first photoresist such that a portion of the first etching stopper and a portion of the first photoresist are located at sidewalls of the first trench, wherein the step of patterning the first etching stopper and the first photoresist comprises exposing the first photoresist using the hard mask layer as a mask, developing the exposed first photoresist and etching the first etching stopper using the developed first photoresist as a mask;

providing a second trench in the insulating substrate corresponding to the first trench.

17. The method of claim 16 further comprising:
removing the hard mask layer, the first etching stopper and the first photoresist.

18. The method of claim 16, further comprising:
providing a second etching stopper and a second photoresist on the insulating substrate including the second trench;
patterning the second etching stopper and the second photoresist such that a portion of the second etching stopper and a portion of the second photoresist are located at sidewalls of the second trench;

providing a third trench in the insulating substrate corresponding to the first trench; and
removing the hard mask layer, the first and second etching stoppers, and the first and second photoresists.

19. The method of claim 18, wherein the step of patterning the second etching stopper and the second photoresist comprises:
exposing the second photoresist with the hard mask layer;
developing the exposed second photoresist; and
etching the second etching stopper.

* * * * *